United States Patent [19]

Kleinknecht

[11] 4,456,879

[45] Jun. 26, 1984

[54] METHOD AND APPARATUS FOR DETERMINING THE DOPING PROFILE IN EPITAXIAL LAYERS OF SEMICONDUCTORS

[75] Inventor: Hans P. Kleinknecht, Bergdietikon, Switzerland

[73] Assignee: RCA Corporation, New York, N.Y.

[21] Appl. No.: 298,581

[22] Filed: Sep. 2, 1981

[51] Int. Cl.³ .............................................. G01R 1/04
[52] U.S. Cl. ................................ 324/158 D; 324/71.5; 324/158 R
[58] Field of Search .............. 324/158 D, 71.5, 158 T, 324/158 R; 372/28; 29/574, 593

[56] References Cited

U.S. PATENT DOCUMENTS

| 3,518,545 | 6/1970 | Copeland | 324/158 R |
| 3,745,454 | 7/1973 | Nikirk et al. | 324/158 D |
| 4,180,784 | 12/1979 | Nelson et al. | 372/28 |
| 4,205,265 | 5/1980 | Staebler | 324/158 D |

OTHER PUBLICATIONS

*Modern Microelectronics,* by Max Fogiel, Research and Education Association, New York, N.Y., 1972, pp. 376-379; 412-413.

Primary Examiner—Michael J. Tokar
Assistant Examiner—Kevin D. O'Shea
Attorney, Agent, or Firm—Birgit E. Morris; Donald S. Cohen; Joseph D. Lazar

[57] ABSTRACT

An apparatus and method for determining the doping profile of an epitaxial layer of a semiconductor as a function of conductivity (or resistivity) vs. distance (depth) includes modifying a d.c. generated current by a focused laser beam modulated at high frequencies in the order of 20 MHz, and directed in sequence on a point-by-point basis to the layer surface. Photocurrent variations from point-to-point effected by the laser beam striking the layer at each of the sequence of points are detected to provide a signal related to conductivity, (or, if desired, resistivity) of the layer material.

18 Claims, 6 Drawing Figures

METHOD AND APPARATUS FOR DETERMINING THE DOPING PROFILE IN EPITAXIAL LAYERS OF SEMICONDUCTORS

This invention relates to the determination of the doping profile in epitaxial layers of semiconductors.

BACKGROUND OF THE INVENTION

In the manufacture of many silicon devices, in particular power devices, one starts with a low resistivity substrate wafer onto which an epitaxial layer is grown by chemical vapor deposition (CVD). Typically, for power devices, an epitaxial layer is approximately 50–100 $\mu$m thick and it provides the basis for the active part of the device. Accordingly, the epitaxial layer is doped during growth from the gas phase in a very precise and well-defined way in order to obtain the required doping profile across the epitaxial layer. For example, for an NPN transistor, located near the substrate, one has an intrinsic layer as a collector field region followed by a P-type base region and an N-type emitter region. It is very important to control and monitor the doping profile for such a transistor very accurately. Monitoring the doping profile can be done, for example, by sacrificing one wafer from each batch that is being processed and grinding a beveled edge through the epitaxial layer of such a wafer. On the bevel surface of the sacrificed wafer, the conductivity is measured across the epitaxial layer with a 2-point probe technique by which 10–100 points are used for the conductivity measurements. Even though the apparatus used to make the conductivity measurements is mechanized and quite automatic, the beveling and measuring procedure is both time consuming as well as being costly. This is so because at every point of measurement across the layer one has to position the contacts, take a current-voltage reading, raise the contacts, move them to the next point for measurement, and so on. See *Modern Microelectronics* by Max Fogiel, Research and Education Association, New York, New York, pp. 412–413 for a description of a typical resistivity measurement using 4-point and 2-point probe techniques.

There is a need in the art, nevertheless, for a procedure for determining doping profiles without requiring point contacts that have to be moved across the layer.

SUMMARY OF THE INVENTION

The present invention provides for an apparatus and method for determining the doping profile in epitaxial layers of semiconductors by modifying a direct current flowing through the epitaxial layer with photocurrents generated by a focused laser beam modulated at high frequencies in the order of 20 MHz. A change in the flow of d.c. current effected by the laser generated photocurrent is monitored to determine the resistivity for each of a plurality of points to which the laser beam is directed.

DETAILED DESCRIPTION OF EMBODIMENTS

Figure 1:
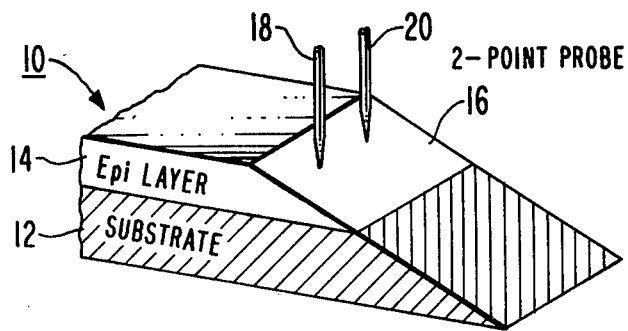
FIG. 1 is a schematic of the prior art technique using a 2-point probe to determine a doping profile.

Before proceeding with a detailed description of several embodiments of the invention, reference is made to FIG. 1 illustrating a device on which a 2-point probe is used to generate a doping profile as described, for example, in the above-identified *Modern Microelectronics* text. A semiconductor body such as a wafer 10 includes a substrate 12 and an epitaxial layer 14. A bevel 16 is provided in the surface to increase the resolution of the doping profile. The bevel is achieved by a technique known as angle lapping which is costly. A pair of probes 18 and 20 are positioned to contact the surface portion 16 of the epitaxial layer 14. D.C. measurements with apparatus, not shown, are made by applying a d.c. voltage across the probes 18 and 20. The probes are repositioned at various locations along the surface 16 with measurements being made at each location. The resistivity (or, if desired, conductivity) is determined by calculation and plotted in a suitable manner to generate what is known as a doping profile.

Figure 2:
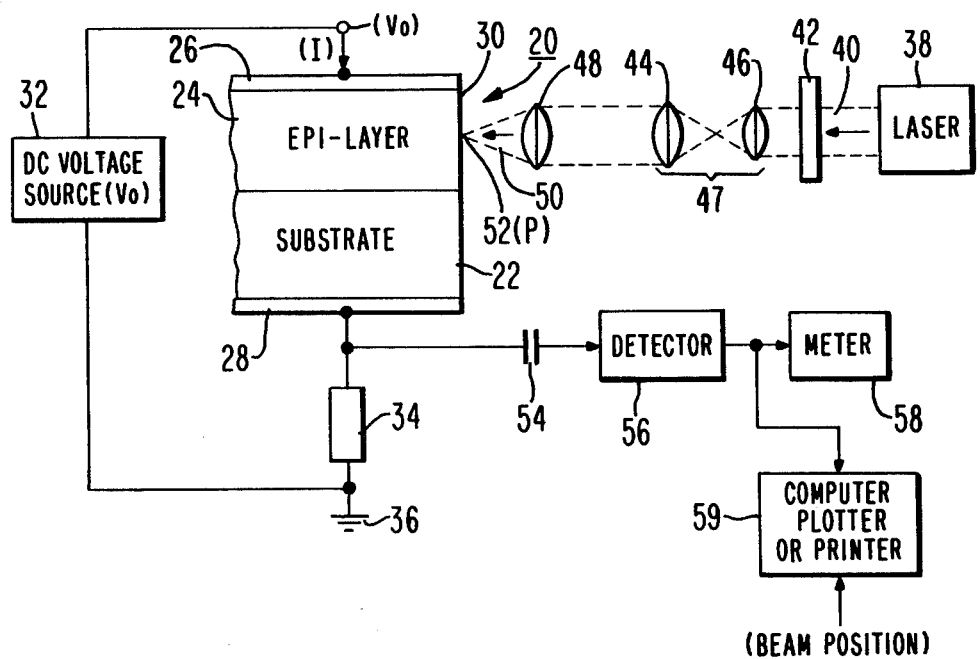
FIG. 2 is a schematic of an apparatus of one embodiment of the present invention.

Reference is made now to FIG. 2 for one embodiment of the invention of the present invention. A wafer 20 having a substrate 22 and an epitaxial layer 24 is provided with a metallic layer 26 on an exposed surface of the epitaxial layer 24 and a metallic conductive layer 28 on the bottom surface of the substrate 22. The wafer is cut to form a flat surface 30. For certain monocrystalline layers such as silicon layers with their planar surfaces oriented parallel to the (110) plane the wafer 20 may be simply broken to provide the surface 30. Moreover, if desired, to increase the resolution of the profile an angle lap of the wafer 20 may be provided similar to that as shown in FIG. 1.

The embodiment being described comprises a wafer formed of silicon. Nevertheless, it should be understood that the invention may be used to determine the doping profile of wafers formed of germanium, gallium arsenide or other semiconductor materials.

A direct current voltage source 32, such as the battery having a terminal voltage $V_0$, is connected to the metallic layer 26 and to the substrate conductor layer 28 through a resistor 34 at the common ground 36. A laser 38, suitably a red He-Ne laser at a wavelength of 0.6328 $\mu$m, provides a beam 40, passed through an optical modulator 42 and thence through a pair of lenses 44 and 46, such as a beam expander 47, and thence to a lens 48, such as a microscope objective. These optical components are arranged to generate a very fine beam 50 of modulated laser light that is oriented to impinge on a surface portion 52 (in general, portion P) of the surface 30. Apparatus (not shown) provides a means to move either the wafer 20 or the light beam apparatus to cause the beam 50 to be directed to any one of a series of points located along the surface 30.

The modulator 42 provides a modulated beam of at least 1 MHz, but preferably at 20 MHz as will be explained hereinafter. The size or diameter of the focused beam 50 is typically 1 $\mu$m or less. When the laser 38 is operated to effect a beam 50 at a point P, d.c. current flowing through the epitaxial layer 24 causes a varying photocurrent that is generated in the vicinity of the epitaxial layer exposed to the beam 50.

The photocurrent generated by the laser beam is monitored according to the invention by a capacitor 54 coupling the voltage across resistor 34 to a detector 56 whose output is coupled to a meter 58.

Detector 56 is a suitable detector such as a filter, a phase sensitive detection amplifier or a heterodyning circuit, as known in the art for detecting a high frequency variation in a d.c. signal. Detector 56 thus provides a current signal from which the conductivity or resistivity of the material at the particular point 52 to which the laser beam 50 was directed can be determined.

The meter 58 will indicate the current ($j_1$) or, if desired, the doping concentration ($N_L$) as will be explained. The resistivity (or conductivity) is calculated, as well known in the art, from the (1) carrier mobility, (2) doping concentration and (3) electron charge. Moreover, if desired, any other device such as a computer plotter 59 (or printer) can be coupled to the detector 56 to provide a plot or print out of the resistivity (or conductivity) directly. The beam position is provided to the plotter (from beam-positioning means not shown) so that the plotter 59 can relate the resistivity in ohm-cm with the laser scanned surface of the depth in microns.

Figure 6:
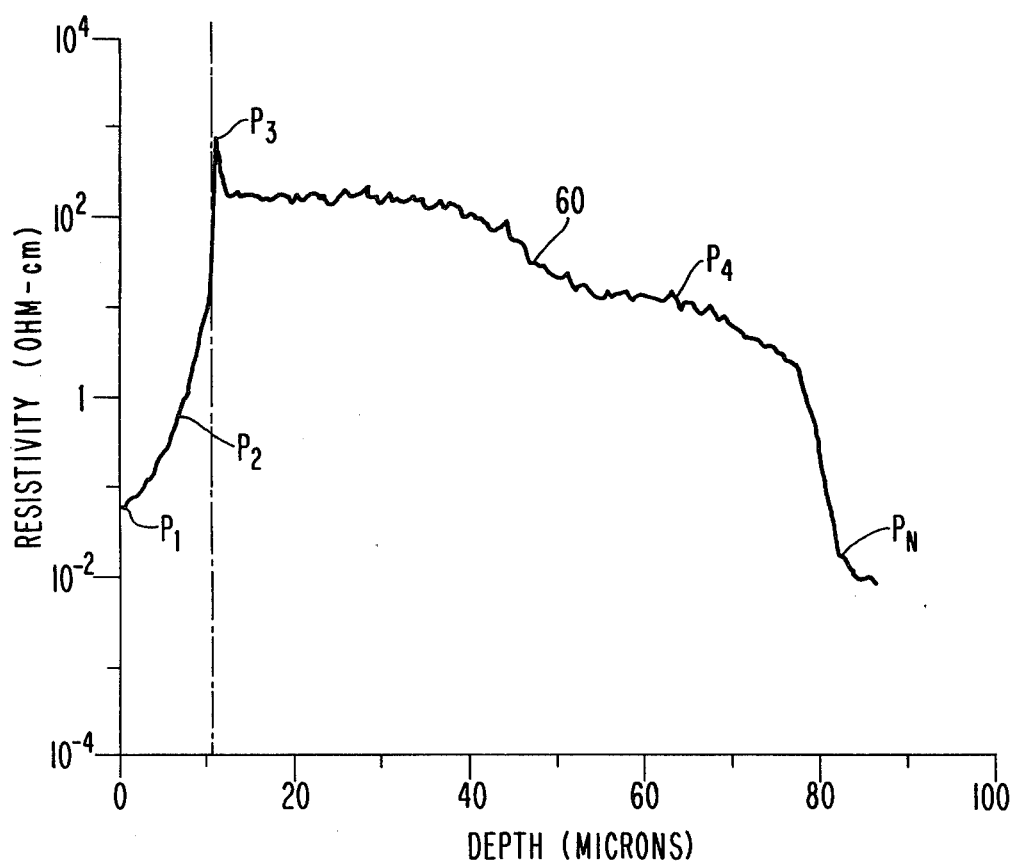
FIG. 6 is a typical plot of resistivity plotted against the depth illustrating the invention.

Reference is made to FIG. 6 for a plot of a typical doping profile using data that is generated by the apparatus of FIG. 2. As shown in FIG. 6, a doping profile curve 60 is generated by the individual points PI ... PN to which the beam 50 was in sequence directed. The resistivity in ohm-cm versus the depth along surface distance is shown plotted in microns.

The beam 50, when directed to the surface 30 at each point P, generates a photocurrent caused by a decrease of the resistance in the layer 24 due to the photogeneration of the electrons and holes at each point P. The effect of the photocarriers generated at each point P depends on the dark resistance and the doping at the location P. In particular, the effect of the photogeneration will be large if the resistance is high, and the doping concentration is low. The converse is true if the resistance is low and the doping concentration is high. Accordingly, the change of the current I due to the laser irradiation by beam 50 is used as a measure for the doping at each location P exposed to the laser beam spot. The change in the current I is often called the photocurrent.

It should be understood that the spacial resolution of this testing procedure is not as fine as the focus of the laser beam 50 because the cloud of electrons and holes spreads and broadens by the diffusion process. If one were to use laser light that was unmodulated and of constant intensity, the spreading effect would be characterized by the minority diffusion length $$L = \sqrt{D\tau} \tag{1}$$

where D is the diffusion constant of the minority carriers (12 cm$^2$/sec) for holes in silicon and $\tau$ the minority lifetime (typically $10^{-6}$ sec) in silicon. With the use of unmodulated light, the resolution manifested by the diffusion length L would be as large as 30 $\mu$m. Such a resolution would be useless since the whole layer is not much thicker than that. However, if in accordance with the present invention the laser beam 40 is modulated at a high frequency f, wherein $f \gg \frac{1}{2}\pi\tau$, then an effective a.c. diffusion length determines the spread of the high frequency component of the carrier cloud. The relationship for the effective diffusion length ($L_{eff}$) is determined by $$L_{eff} = \sqrt{D/2\pi f} \tag{2}$$

using the diffusion constant D of 12 cm$^2$/sec and a frequency of 20 MHz results in an effective diffusion length of about 3 $\mu$m. Accordingly, monitoring the a.c. component of the photocurrent at the frequency f of the light modulation results in sufficient spacial resolution for generating a useful doping profile. Moreover, the measurement of determining the photocurrent is independent of the minority carrier lifetime $\tau$ which it should be noted is not present in equation (2).

The wavelength of the laser 38 is chosen such that the light penetration into the silicon material of the epitaxial layer 24 is large enough to have a reasonable effect on the photocurrent. Moreover, the wavelength sould not be so large as to sacrifice focus and spacial resolution. The preferred form of laser according to these guidelines for silicon is a He-Ne laser with a wavelength of 0.6328 $\mu$m. The penetration of the beam 50 from such a laser into silicon is about 3 $\mu$m, which value it will be noticed, is equal to the solution of equation (2) described above.

Figure 3:
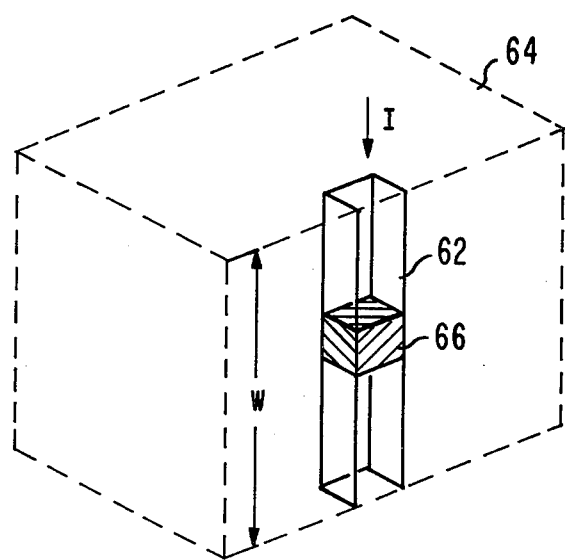
FIG. 3 is a schematic of a model of a portion of an epitaxial layer for illustrating the principle of the present invention.

A theoretical analysis has been made of the effect described hereinabove based on one of several assumptions that the sample of a wafer consists of a thin and narrow filament 62 where the whole cross section is filled with photocarriers at the laser focus. This is what is known as one dimensional model. As illustrated in FIG. 3, there is represented by the solid lines the filament 62 while the real sample 64 is represented by the dashed lines. The cross-hatched volume 66 in the middle portion of the filament 62 contains the photogenerated carrier cloud. Other assumptions of the model are that the photocarrier concentration is small compared to the background doping and the current is small enough such that the carrier cloud is not swept away significantly by the d.c. field effected by the source voltage 32 (see FIG. 2). Accordingly, the ratio of the a.c. photocurrent $j_1$ to the d.c. current J may be represented as follows $$\frac{j_1}{J} = \left(\frac{2L_{eff}}{W}\right) \cdot \left(\frac{\bar{N} P_1}{N_L^2}\right) \tag{3}$$

where W, as shown in FIG. 3, is the epitaxial layer thickness and is accordingly the length of the filament 62, $\bar{N}$ is the average doping across the whole epitaxial layer, $N_L$ is the doping concentration the location of the light spot p (which, it should be noted, corresponds to the entire volume 66 as shown in FIG. 3) and $P_1$ is the concentration of the photogenerated carriers at the same light spot position. Substituting the values Phd $1/N_L \approx 1/10$, $L_{eff} = 2.5$ $\mu$m, $\bar{N} \approx N_L$ and W=100 $\mu$m, Equation (3) is calculated to be $j_1/J \approx 5 \cdot 10^{-3}$. It should be understood that the filament 62 in reality is embedded in a real sample as represented by the dashed lines 64 of about 100 times the width and 100 times the depth. Thus, the model calculation of equation (3) is reduced by a factor of $10^4$, resulting in the value of the ratio $j_1/J > 5 \cdot 10^{-7}$. Such a current ratio value is large enough to be detected by state-of-the-art electronic filtering techniques as illustrated by detector 56 in FIG. 2. It should be noted that in accordance with equation (3), the high frequency photocurrent $j_1$ is inversely proportional to the square of the doping concentration at the light spot position.

Figure 4:
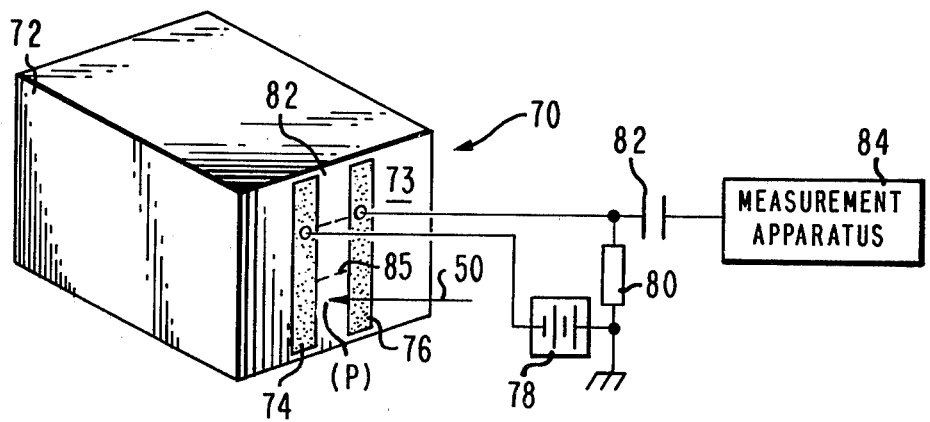
FIG. 4 is a schematic of a modification of the epitaxial layer for practicing the invention.

Reference is now made to FIG. 4, illustrating a modification of the wafer arrangement for determining the doping profile according to the invention. A wafer 70, having an epitaxial layer 72, is provided with a pair of metallic striped coatings 74 and 76 serving as the metallic contacts. A voltage source 78 is connected to terminal 74 and to ground. The other contact 76 is connected to a resistor 80 and a capacitor 82. The capacitor 82 is connected to the measuring apparatus 84 such as detector 56 and meter 58 illustrated in FIG. 2. The pair of striped contacts 74 and 76 are applied to a cleaved, cross-sectioned or beveled surface 73 of the epitaxial layer 72. The laser beam 50 is directed to the surface portion 82 between the conductors 74 and 76 in sequence at various points. At each position of the beam 50 a measurement is made of the photocurrent variations. It will be noticed that the current flow generated by the arrangement of FIG. 4 is parallel to the plane of the epitaxial layer 72 as along dotted line 85. Nevertheless, a photoconductor component of the current due to the modulated laser beam 50 is measured.

Figure 5:
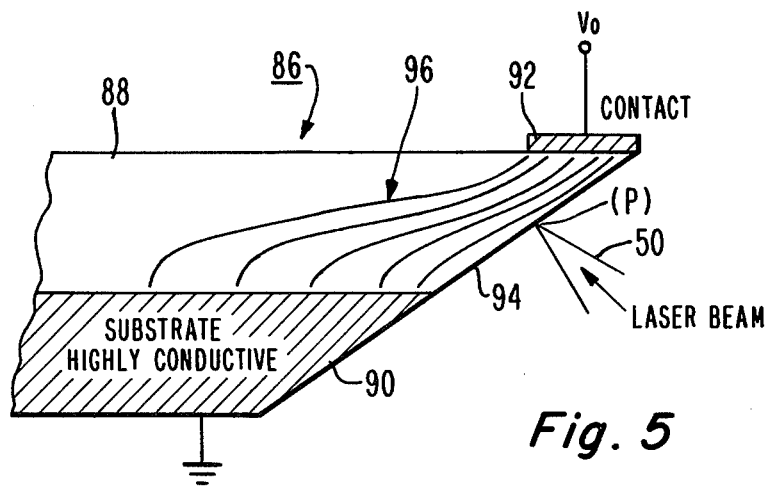
FIG. 5 is a schematic of another modification of the epitaxial layer for practicing the invention.

Reference is now made to FIG. 5 illustrating another arrangement for the measurement of a doping profile. A wafer 86 has an epitaxial layer 88 and a highly conductive substrate 90. A metallic contact 92 is applied to the extremity of a negative-beveled surface 94. The laser beam 50 is applied to the surface 94 in sequence at different locations to develop the doping profile. The current flow will follow generally the contoured lines 96. According to the arrangement of FIG. 5, the sensitivity of the profile measurements is increased by constraining the current 96 to the surface 94 in the negatively beveled sample.

What I claim is:

1. Apparatus for determining the doping profile in an epitaxial layer of semiconductor material comprising:
   (a) means for applying direct current to an epitaxial layer of a semiconductor;
   (b) means for providing a laser beam modulated at a relatively high frequency;
   (c) means for focusing and directing said laser beam to one or more locations in sequence on an exposed surface of said layer to cause photocurrents to generate current flow variations in the layer; and
   (d) means for monitoring said current flow variations including means for detecting a signal representing said photocurrent variations.

2. The apparatus according to claim 1, wherein said laser beam is modulated at a frequency of at least 1 MHz.

3. The apparatus according to claim 1, wherein said semiconductor layer is beveled.

4. The apparatus according to claim 1, wherein said laser beam focusing means includes a beam expander and a microscopic objective lens for focusing said beam to a small diameter.

5. The apparatus according to claim 4, wherein said beam is focused with a diameter no greater than 1 $\mu$m.

6. The apparatus according to claim 1, wherein said detecting means includes a filter for detection of said signal representing the photocurrent variations.

7. The apparatus according to claim 1, wherein said detecting means includes a phase sensitive detection means for detection of said signal representing the photocurrent variations.

8. The apparatus according to claim 1, wherein said detecting means includes a heterodyning means for detection of said signal representing the photocurrent variations.

9. The apparatus according to claim 1, wherein said laser means comprises a He-Ne laser at a wavelength of 0.6328 $\mu$m.

10. The apparatus according to claim 1, wherein said d.c. applying means includes a pair of contacts spaced apart respectively on the upper surface of the epitaxial layer and the lower surface of the semiconductor substrate.

11. The apparatus according to claim 1, wherein said d.c. applying means includes a pair of contacts on the surface of said epitaxial layer for connection to direct current and positioned so that current flows parallel to the plane of the epitaxial layer.

12. The apparatus according to claim 1, wherein said layer of said semiconductor material is arranged so that said layer is beveled relative to a substrate of said layer and extends longitudinally outwardly from the substrate, a relatively small area contact being formed on the upper surface of the epitaxial layer, whereby said current flow variations in the beveled epitaxial layer are significantly enhanced.

13. A method for determining the doping profile in an epitaxial layer of a semiconductor comprising the steps of:
   (a) applying direct current to an epitaxial layer of a semiconductor;
   (b) providing a laser beam modulated at a relatively high frequency;
   (c) focusing and directing said laser beam to one or more locations in sequence on an exposed surface of said layer to cause photocurrent to generate current flow variations in the layer;
   (d) monitoring said current flow variations to generate a doping profile of the layer along the path of one or more of said locations by detecting a signal representing said photocurrent variations.

14. The method according to claim 13, comprising modulating the laser beam at a frequency of at least 1 MHz.

15. The method according to claim 13, comprising the step of focusing the laser beam to a diameter of 1 $\mu$m or less.

16. The method according to claim 13, wherein said monitoring step comprises phase sensitive detecting the current flow for determining said photocurrent variations in the current.

17. The method according to claim 13, wherein said monitoring step comprises filtering the current flow for determining said photocurrent variations in the current.

18. The method according to claim 13, wherein said monitoring step comprises heterodyning the current flow for determining said photocurrent variations in the current.

* * * * *